(12) United States Patent
Kweon et al.

(10) Patent No.: US 11,410,935 B2
(45) Date of Patent: Aug. 9, 2022

(54) SEMICONDUCTOR PACKAGE USING CAVITY SUBSTRATE AND MANUFACTURING METHODS

(71) Applicant: Amkor Technology Singapore Holding PTe. Ltd., Singapore (KR)

(72) Inventors: Young Do Kweon, Boise, ID (US);
JeongByung Chae, Incheon (KR);
DongJoo Park, Icheon (KR);
ByoungWoo Cho, Seoul (KR);
SeHwan Hong, Seoul (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 16/889,971

(22) Filed: Jun. 2, 2020

(65) Prior Publication Data
US 2020/0303315 A1 Sep. 24, 2020

Related U.S. Application Data

(63) Continuation of application No. 15/953,591, filed on Apr. 16, 2018, now Pat. No. 10,672,715.

(51) Int. Cl.
*H01L 23/538* (2006.01)
*H01L 23/00* (2006.01)
(Continued)

(52) U.S. Cl.
CPC ........ *H01L 23/5389* (2013.01); *H01L 21/561* (2013.01); *H01L 21/563* (2013.01);
(Continued)

(58) Field of Classification Search
CPC . H01L 23/13; H01L 23/3121; H01L 23/3128; H01L 23/3142; H01L 23/5384;
(Continued)

(56) References Cited

U.S. PATENT DOCUMENTS

8,030,722 B1 10/2011 Bolognia et al.
8,130,507 B2 * 3/2012 Origuchi ................ H05K 7/00
361/760
(Continued)

*Primary Examiner* — Matthew E Warren
(74) *Attorney, Agent, or Firm* — McAndrews, Held & Malloy, Ltd.

(57) ABSTRACT

A semiconductor package includes a cavity substrate, a semiconductor die, and an encapsulant. The cavity substrate includes a redistribution structure and a cavity layer on an upper surface of the redistribution structure. The redistribution structure includes pads on the upper surface, a lower surface, and sidewalls adjacent the upper surface and the lower surface. The cavity layer includes an upper surface, a lower surface, sidewalls adjacent the upper surface and the lower surface, and a cavity that exposes pads of the redistribution structure. The semiconductor die is positioned in the cavity. The semiconductor die includes a first surface, a second surface, sidewalls adjacent the first surface and the second surface, and attachment structures that are operatively coupled to the exposed pads. The encapsulant encapsulates the semiconductor die in the cavity and covers sidewalls of the redistribution structure.

20 Claims, 7 Drawing Sheets

(51) Int. Cl.
  *H01L 23/31* (2006.01)
  *H01L 21/56* (2006.01)
  *H01L 25/10* (2006.01)
  *H01L 25/00* (2006.01)
  *H01L 23/13* (2006.01)
  *H01L 25/16* (2006.01)

(52) U.S. Cl.
  CPC .......... *H01L 23/13* (2013.01); *H01L 23/3128* (2013.01); *H01L 23/3142* (2013.01); *H01L 23/5384* (2013.01); *H01L 23/5387* (2013.01); *H01L 24/19* (2013.01); *H01L 24/20* (2013.01); *H01L 24/97* (2013.01); *H01L 25/105* (2013.01); *H01L 25/50* (2013.01); *H01L 25/16* (2013.01); *H01L 2224/211* (2013.01); *H01L 2225/1023* (2013.01); *H01L 2225/1058* (2013.01); *H01L 2924/19102* (2013.01)

(58) Field of Classification Search
  CPC ............. H01L 23/5387; H01L 23/5389; H01L 21/561; H01L 21/563; H01L 24/19; H01L 24/20; H01L 24/97; H01L 25/105; H01L 25/16; H01L 25/50
  USPC .................................................. 257/686, 687
  See application file for complete search history.

(56) References Cited

U.S. PATENT DOCUMENTS

| | | |
|---|---|---|
| 9,260,298 B1 | 2/2016 | Liao et al. |
| 9,345,142 B2 | 5/2016 | Moon et al. |
| 2005/0087850 A1 | 4/2005 | Nishikawa et al. |
| 2006/0128069 A1 | 6/2006 | Hsu |
| 2008/0102410 A1 | 5/2008 | Kim et al. |
| 2008/0298621 A1 | 12/2008 | Theuss et al. |
| 2012/0153771 A1 | 6/2012 | Formosa et al. |
| 2013/0249101 A1 | 9/2013 | Lin et al. |
| 2014/0037120 A1 | 2/2014 | Lim et al. |
| 2014/0062607 A1 | 3/2014 | Nair et al. |
| 2014/0131819 A1 | 5/2014 | Gritti et al. |
| 2015/0091108 A1 | 4/2015 | Huang et al. |
| 2015/0189757 A1 | 7/2015 | Kim et al. |
| 2016/0197063 A1* | 7/2016 | Lin .................... H01L 23/5389 257/686 |
| 2016/0221820 A1 | 8/2016 | Lee et al. |
| 2016/0316557 A1 | 10/2016 | Lee et al. |
| 2017/0033083 A1 | 2/2017 | Lin et al. |
| 2020/0053483 A1* | 2/2020 | Theuss .................. H04R 19/04 |

* cited by examiner

SEMICONDUCTOR PACKAGE USING CAVITY SUBSTRATE AND MANUFACTURING METHODS

FIELD OF THE DISCLOSURE

Various aspects of the present disclosure relate to semiconductor packages and manufacturing methods thereof.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

Common reference numerals are used throughout the drawings and the detailed description to indicate the same and/or similar elements.

DETAILED DESCRIPTION

Various aspects of the present disclosure can be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

According to various embodiments of the present disclosure, a semiconductor package comprising a cavity substrate, a semiconductor die, and an encapsulant. The cavity substrate includes a redistribution structure and a cavity substrate one the redistribution structure. The redistribution structure includes an upper surface having pads, a lower surface opposite the upper surface, and sidewalls adjacent the upper surface and the lower surface. The cavity layer includes an upper surface, a lower surface opposite the upper surface, sidewalls adjacent the upper surface and the lower surface, and a cavity in the upper surface that exposes pads of the redistribution structure. The semiconductor die is positioned in the cavity. The semiconductor die includes a first surface, a second surface opposite the first surface, sidewalls adjacent the first surface and the second surface, and attachment structures along the second surface that are operatively coupled to the exposed pads. The encapsulant encapsulates the semiconductor die in the cavity and covers the sidewalls of the redistribution structure. A semiconductor package can be stack physically and electrically coupled to an upper surface of the semiconductor package.

According to further embodiments of the present disclosure, a semiconductor package includes a cavity substrate, a semiconductor die, and an encapsulant. The cavity substrate includes a redistribution structure and cavity layer on the redistribution structure. The redistributions structure includes an upper surface having pads, a lower surface opposite the upper surface, and sidewalls adjacent the upper surface and the lower surface. The cavity layer includes an upper surface, a lower surface opposite the upper surface, sidewalls adjacent the upper surface and the lower surface, a cavity in the upper surface that exposes pads of the redistribution structure, and a trench that passes through a sidewall of the cavity layer. The semiconductor die is positioned in the cavity. The semiconductor die includes a first surface, a second surface opposite the first surface, sidewalls adjacent the first surface and the second surface, and attachment structures along the second surface that are operatively coupled to the exposed pads. The encapsulant encapsulates the semiconductor die in the cavity and fills the trench. A semiconductor package can be stack physically and electrically coupled to an upper surface of the semiconductor package.

According to yet other embodiments of the present disclosure, a method of fabricating a semiconductor package includes placing a plurality of semiconductor dies in a plurality of cavity substrates. The method further includes attaching attachment structures of each semiconductor die to pads of a redistribution structure that are exposed by a cavity of each cavity substrate. The method also includes encapsulating, via an encapsulating material, the plurality of semiconductor dies in the plurality of cavity substrates.

In the drawings, the thickness of layers and regions are exaggerated for clarity. Here, like reference numerals refer to like elements throughout. As used herein, the term "and/or" includes any and all combinations of one or more of the associated listed items. It will also be understood that when an element A is referred to as being "connected to" an element B, the element A can be directly connected to the element B or an intervening element C can be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise, include" and/or "comprising, including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. can be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein can be interpreted accordingly.

Furthermore, the term "coplanar" and similar terms are used herein to denote two surfaces that lie within the same plane. Coplanar surfaces can be adjacent or adjoining each other; however non-adjacent and/or non-adjoining surfaces can also be coplanar. For example, a gap, a void, and/or other structures can be interposed between the coplanar surfaces. Furthermore, due to manufacturing tolerances, thermal expansion, and the like, slight deviations can exist in coplanar surfaces. Such deviations can result in one surface being slightly higher than the other surface, thus forming a step-off (e.g., a step-up or step-down) between surfaces. As used herein, the term "coplanar" includes surfaces having a step-off ranging between 0 and 7 microns.

Figure 1:
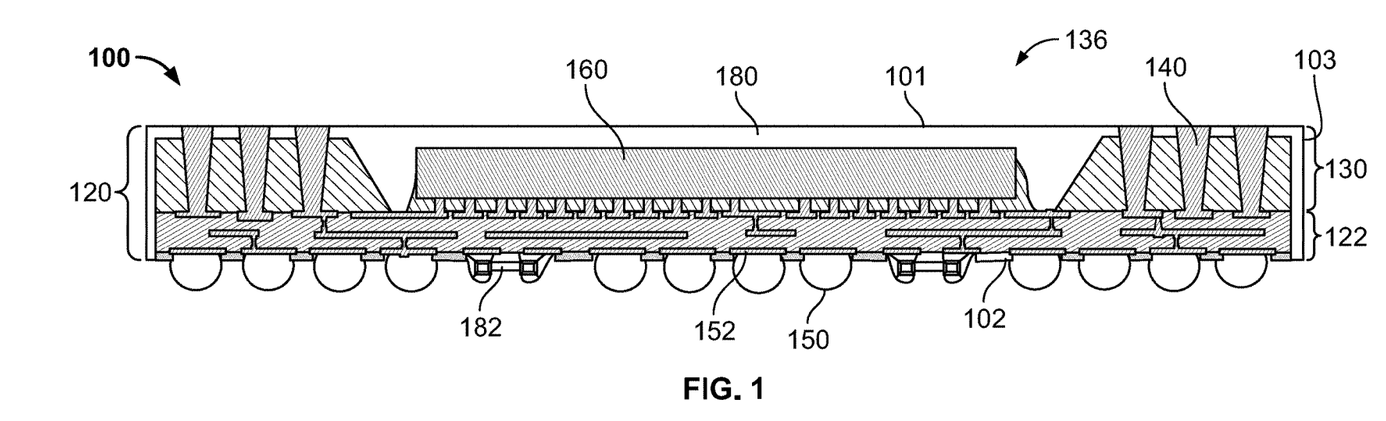
FIG. 1 provides a cross-sectional view of an embodiment of a semiconductor package fabricated in accordance with the present disclosure.

Referring now to FIG. 1, a cross-sectional view is provided that depicts a semiconductor package 100 in accordance with aspects of the present disclosure. In particular, the semiconductor package 100 comprises an upper surface 101, a lower surface 102 opposite the upper surface 101, and one or more side surfaces or sidewalls 103 that join the upper surface 101 to the lower surface 102. The upper surface 101 and lower surface 102 can each provide a generally planar surface. Moreover, the upper surface 101 can be parallel to the lower surface 102. The sidewalls 103 can adjoin the upper surface 101 to the lower surface 102. In some embodiments, the sidewalls 103 can provide planar surfaces that are perpendicular to the upper surface 101 and the lower surface 102.

The semiconductor package 100 can include a cavity substrate 120, external electrical connectors 150, a semiconductor die 160, and an encapsulant 180. The cavity substrate 120 can include a redistribution structure 122 and a cavity layer 130 on the redistribution structure 122.

Figure 7A:
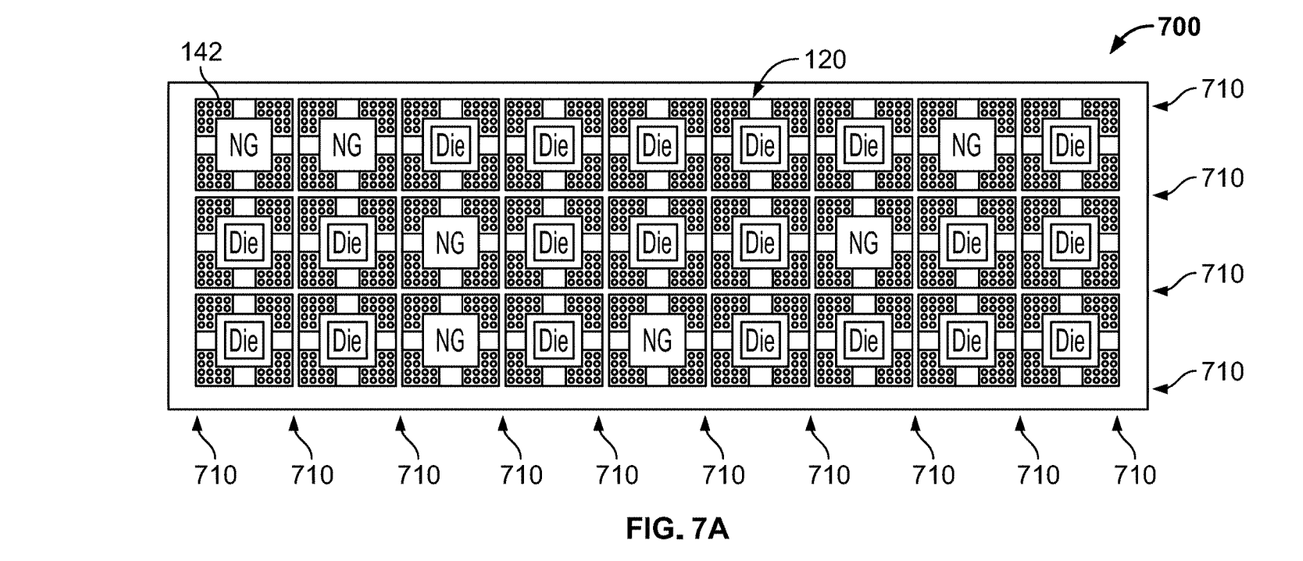
FIG. 7A depicts a panel of cavity substrates used in the fabrication of the semiconductor package of FIG. 1.
Figure 7B:
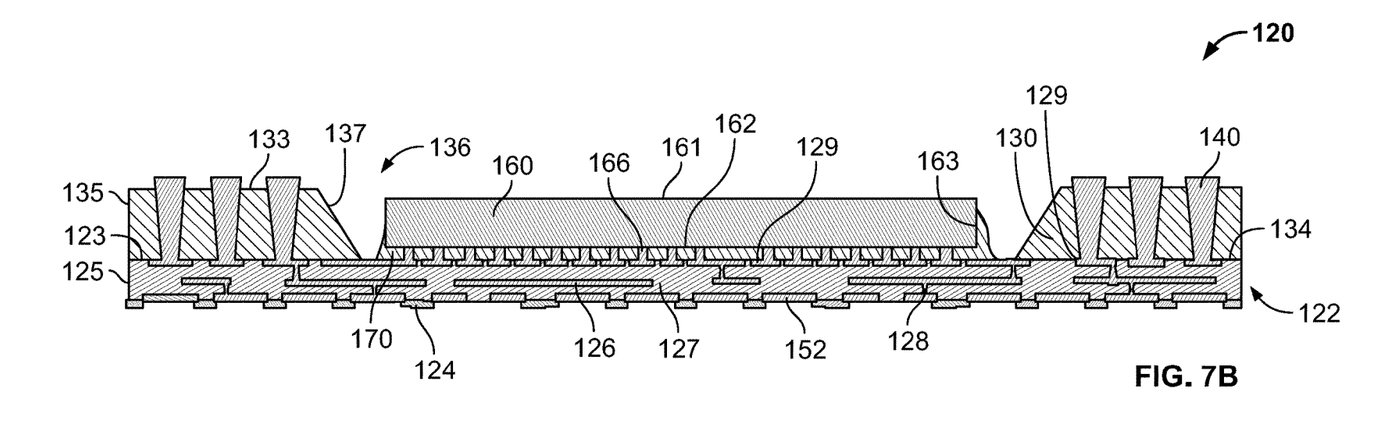
FIG. 7B provides a cross-sectional view of a cavity substrate of FIG. 7A with an attached semiconductor die.

As shown better in FIG. 7B, the redistribution structure 122 can include an upper surface 123, a lower surface 124 opposite the upper surface 123, and one or more side surfaces or sidewalls 125 adjacent the upper surface 123 and the lower surface 124. The upper surface 123 and lower surface 124 can each provide a generally planar surface. Moreover, the upper surface 123 can be parallel to the lower surface 124. The sidewalls 125 can adjoin the upper surface 123 to the lower surface 124. In some embodiments, the sidewalls 125 provide planar surfaces that are perpendicular to the upper surface 123 and the lower surface 124.

The redistribution structure 122 can include one or more conductive layers 126, one or more interdielectric layers 127 that separate the one or more conductive layers 126, and one or more conductive vias 128 that pass through one or more interdielectric layers 127 and electrically couple conductive layers 126 separated by the interdielectric layers 127. As shown, the uppermost conductive layer 126 can provide or be coupled to contact pads 129 on the upper surface 123 of the redistribution structure 120. The lowermost conductive layer 126 can provide or be coupled to one or more pads and/or lands 152 to which external electrical connectors 150 can be attached. The conductive layers 126 and conductive vias 128 can electrically couple the lands 152 on the lower surface 124 of the redistribution structure 122 to the contact pads 129 on the upper surface 123 of the redistribution structure 122.

The cavity substrate 120 can further include a cavity layer 130 on the upper surface 123 of the redistribution structure 122. The cavity layer 130 can include a variety of types of insulating or non-conductive materials. For example, the cavity layer 130 can comprise a single layer of non-conductive material, such as a polymer composite material, a polymer having a filler, an epoxy resin, an epoxy acrylate having a filler such as silica or other inorganic material, a mold compound, a silicone resin, a resin-impregnated B-stage pre-preg film, etc.

The cavity layer 130 can include an upper surface 133, a lower surface 134 opposite the upper surface 133, and one or more side surfaces or sidewalls 135 adjacent the upper surface 133 and the lower surface 134. The upper surface 133 and lower surface 134 can each provide a generally planar surface. Moreover, the upper surface 133 can be parallel to the lower surface 134. The sidewalls 135 can adjoin the upper surface 133 to the lower surface 134. In some embodiments, the sidewalls 135 provide planar surfaces that are perpendicular to the upper surface 133 and the lower surface 134.

As further shown, the cavity layer 130 can include a cavity 136 in the upper surface 133. In particular, the cavity 136 can be defined by inner walls 137 that pass through the upper surface 133 to the lower surface 134 of the cavity layer 130. The cavity 136 can exposing contact pads 129 on the upper surface 123 of the redistribution structure 122. As shown, the cavity 136 can be positioned toward a central portion of the cavity layer 136, thus exposing a corresponding central portion of the redistribution structure 122. In the depicted embodiment, the cavity 136 is positioned in the center of the upper surface 133; however, the cavity 136 can be offset from center in other embodiments. Regardless, the inner walls 137 generally circumscribe or encompass the cavity 136 and the sidewalls 135 of the cavity layer 130 generally circumscribe or encompass the inner walls 137 of the cavity 136.

Figure 2:
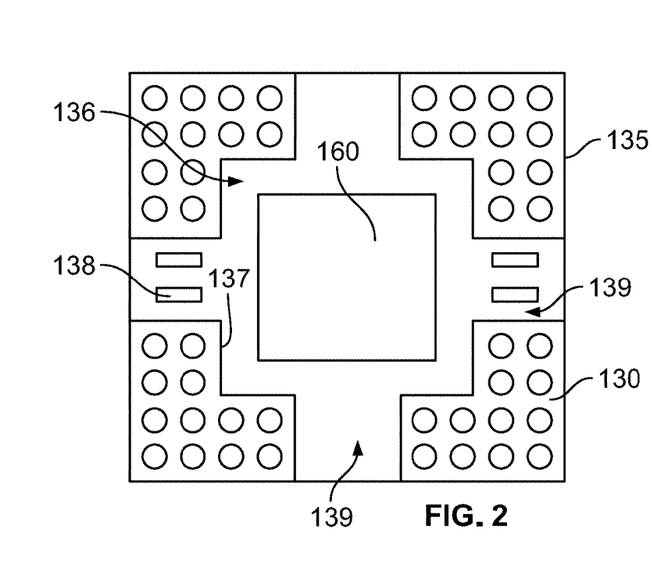
FIG. 2 provides a plan view of the semiconductor package of FIG. 1 depicting an embodiment of sidewall trenches.

As better depicted in top view provided in FIG. 2, the cavity layer 130 can include one or more trenches 139 that each provide a channel between the sidewalls 135 of the cavity layer 130 and inner walls 137 of the cavity 136. As shown in FIG. 2, the cavity 136 can be defined by four inner walls 137 and a trench 139 can pass between each inner wall 137 and its respective sidewall 135. As shown, the trenches 139 can pass through the center or central portion of each inner wall 137. However, the trenches 139 in some embodiment can be offset from the center of each inner wall 137. As explained in greater detail below, the trenches 139 can aid in encapsulating the semiconductor package 100 by providing a path for encapsulating material to flow between the cavity 136 and the sidewalls 135 during an encapsulating process. Furthermore, while FIG. 2 depicts a single trench 139 through each inner wall 137 of the cavity 136, other embodiments can include multiple trenches 139 through each inner wall 137 or can include inner walls 137 without trenches 139 as shown in FIG. 3.

The cavity substrate 120 can also include internal interconnect structures 140. The internal interconnect structures 140 can include any of a variety of conductive structures that pass through the cavity layer 130. In particular, the internal interconnect structures 140 can span between the upper surface 133 and the lower surface 134 of the cavity layer 130 in order to provide electrical pathways through the cavity substrate 130. To this end, the internal interconnect structures 140 can include solder balls, solder bumps, multi-ball solder columns, elongated solder balls, metal (e.g., copper) core balls with a layer of solder over a metal core, plated pillar structures (e.g., copper pillars, etc.), wire structures (e.g., wire bonding wires), through mold via (TMV) structures, etc.

Figure 3:
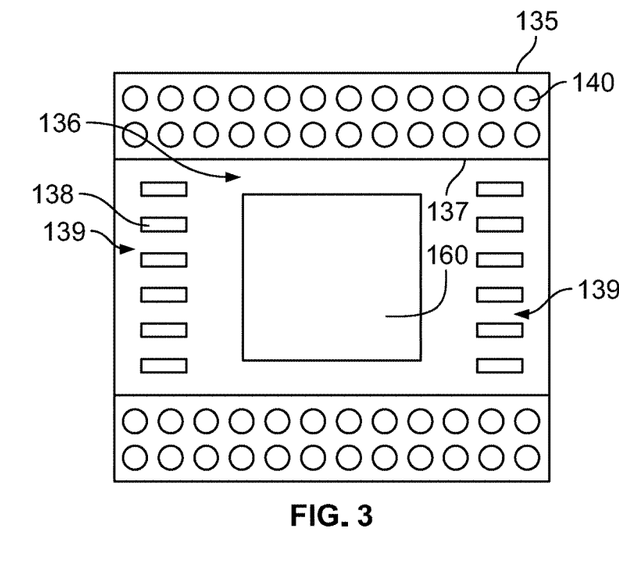
FIG. 3 provides a plan view of the semiconductor package of FIG. 1 depicting another embodiment of sidewall trenches.

As depicted in FIGS. 1-3 and 7B, the internal interconnect structures 140 can be positioned between the inner walls 137 of the cavity 136 and the sidewalls 135 of the cavity layer 130. As such, the internal interconnect structures 140 can be positioned about a periphery of the cavity layer 130 and can generally circumscribe the cavity 136. As further shown, the internal interconnect structures 140 can be further positioned such that the internal interconnect structures 140 pass through portions of the cavity layer 130 that are distinct from the portions through which the trenches 139 pass. For example, the internal interconnect structures 140 can pass through corner portions of the sidewalls 135 while the trenches 139 pass central through central portions of the sidewalls 135 as shown in FIG. 2. In other embodiments, the internal interconnect structures 140 can pass through central portions of a subset of the sidewalls 135 while the trenches 139 pass central through central portions of a different subset of the sidewalls 135 as shown in FIG. 3.

Referring back to FIG. 1, the external electrical connectors 150 can be attached to lands 152 of the redistribution layer 122. In particular, the external electrical connectors 150 can include conductive bumps, conductive balls, conductive pillars, and/or other conductive structures electrical that are physically attached to the lands 152 of the redistribution structure 122. In general, the external electrical connectors 150 provide structures for operatively connecting the semiconductor package 100 to another semiconductor package, circuit board, etc. Furthermore, the external electrical connectors 150 can be formed of conductive materials such as any one of or a combination of copper, nickel, gold, solder, etc.

As shown in FIGS. 1 and 7B, the semiconductor die 160 can include a first surface 161, a second surface 162 parallel to the first surface 161, and one or more side surfaces or sidewalls 163 adjoining the first surface 161 to the second surface 162. The first surface 161 and the second surface 162 can each provide a generally planar surface. Moreover, the first surface 161 can be parallel to the second surface 162. The sidewalls 163 can adjoin the first surface 161 to the second surface 162. In some embodiments, the sidewalls 162 can provide planar surfaces that are perpendicular to the first surface 161 and the second surface 162.

The semiconductor die 160 can also include conductive attachment structures 166 along the second surface 162 that are electrically coupled to one or more integrated circuit components of the semiconductor die 160. Furthermore, the semiconductor die 160 can be positioned within the cavity 136 and the conductive attachment structures 166 can be physically and electrically attached to contact pads 129 on the upper surface 123 of the redistribution structure 122. In this manner, the integrated circuit components can be electrically coupled to the external connection structures 140 via the redistribution structure 122.

In the depicted embodiment, the sidewalls 135 of the cavity layer 130 are taller than the height of the attached semiconductor die 160. In particular, the first surface 161 of the semiconductor die 160 is closer to the upper surface 133 of the redistribution structure 122 than the upper surface 133 of the cavity layer 130 is to the upper surface 133. As such, the semiconductor die 160 resides within the cavity 136. However, in other embodiments, the first surface 161 of the semiconductor die 160 can be coplanar with the upper surface 133 of the cavity layer 130 still resulting in the semiconductor die 160 residing within the cavity 136. In yet other embodiments, the sidewalls 135 of the cavity layer 130 are shorter than the height of the attached semiconductor die 160. In such embodiments, the first surface 161 of the semiconductor die 160 is further from the upper surface 133 of the redistribution structure 122 than the upper surface 133 of the cavity layer 130 is from the upper surface 133. As such, while the semiconductor die 160 is in the cavity 136, the semiconductor die 160 does not reside completely within the cavity 136.

The semiconductor die 160 can be selected from any of a variety of types of semiconductor dies, non-limiting examples of which are provided herein. For example, the semiconductor die 160 can include a digital signal processor (DSP), a microcontroller, a microprocessor, a network processor, a power management processor, an audio processor, a video processor, an RF circuit, a wireless baseband system-on-chip (SoC) processor, a sensor, a memory controller, a memory device, an application specific integrated circuit, etc.

Moreover, a single semiconductor die 160 is shown in FIG. 1. However, in some embodiments, the cavity 136 of the semiconductor package 100 can include more than one semiconductor die 160 attached to the redistribution structure 122.

An underfill 170 can be formed between the semiconductor die 160 and the cavity substrate 120. In particular, the underfill 170 can surround exposed portions of the conductive attachment structures 166 and the contact pads 129, thereby encapsulating them in the underfill 170. The underfill 170 can comprise any of a variety of underfill materials. Also, the underfill 170 can be formed utilizing a variety of processes (e.g., a capillary underfilling process, utilizing a pre-applied underfill material, etc.). The underfill 170 between the semiconductor die 160 and the redistribution structure 122 of the cavity substrate 120 can prevent or reduce warpage, for example due to differences in thermal expansion coefficients of the semiconductor die 160 and the cavity substrate 120.

The encapsulant 180 can cover and encapsulate the cavity substrate 120 and the attached semiconductor die 160, thereby further securing the semiconductor die 160 to the cavity substrate 120. In an example embodiment, the encapsulant 180 can cover the first surface 161 and sidewalls 163 of the semiconductor die 160. In another example embodiment, the encapsulant 180 can cover the sidewalls 163 of the semiconductor die 160 (or only respective portions thereof), but can leave the first surface 161 of the semiconductor die 160 exposed.

Moreover, as noted above, one or more trenches 139 provide channels that pass between the sidewalls 135 of the cavity layer 130 and the sidewalls 137 of the cavity 136. As such, the encapsulant 180 can further fill the trenches 139 and cover the sidewalls 135 of the cavity layer 130 as well as the sidewalls 125 of the redistribution structure 122. In this manner, the encapsulant 180 can cover and protect the sidewalls of the cavity substrate 120.

The encapsulant 180 can be formed in a variety of manners (e.g., compression molding, transfer molding, flood molding, etc.). Moreover, the encapsulant 180 can include a variety of types of encapsulating material. In some embodiments, the encapsulant 180 can comprise an insulating or non-conductive material similar to the cavity layer 130. In such embodiments, the encapsulant 180 can have a greater filler content than the cavity layer 130. In some embodiments, the encapsulant 180 can comprise an epoxy, a thermosetting epoxy molding compound, a room temperature curing type compound, or other encapsulating material.

If the size of a filler (e.g., in inorganic filler or other particle component) of the material for the encapsulant 180 is smaller than the gap between the cavity substrate 120 and the semiconductor die 160, then a separate underfill material might not be utilized. Thus, in some embodiments, the encapsulant 180 can fill the gap between semiconductor die 160 and the cavity substrate 120.

The semiconductor package 100 can also include one or more passive electrical components 182 such as, for example, resistors, capacitors, etc. Such passive electrical components 182 can reside within the cavity 160 with the semiconductor die 110. However, in some embodiments, passive components 182 can be alternatively, and/or additionally be placed along the lower surface 124 of the cavity substrate 120 as shown in FIG. 1.

Figure 4:
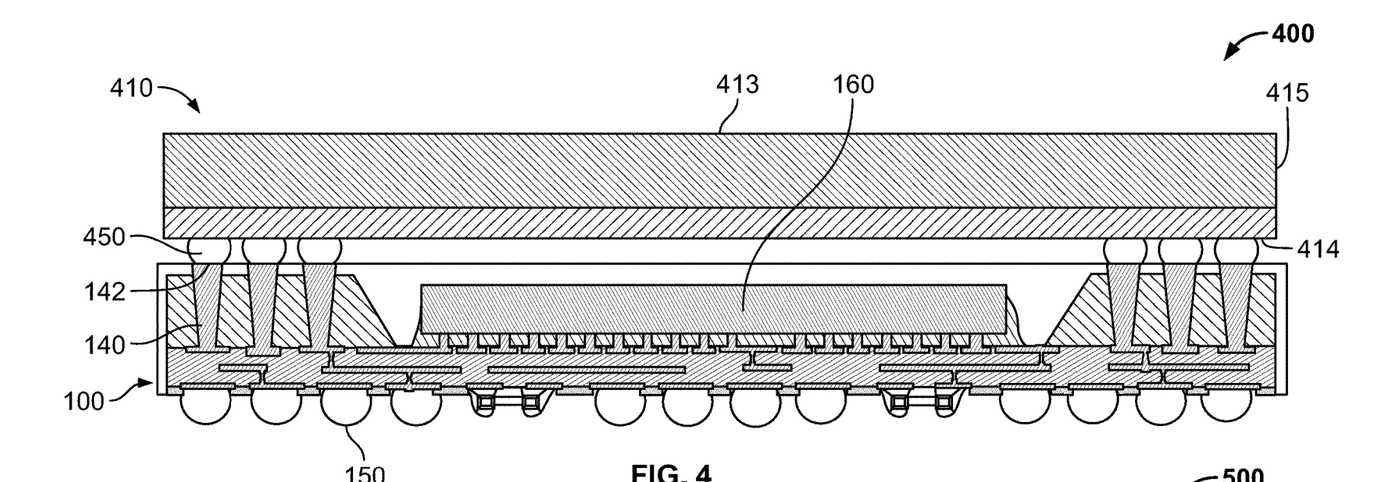
FIG. 4 provides a cross-sectional view of a package-on-package configuration utilizing the semiconductor package of FIG. 1.

As shown in FIG. 4, the semiconductor package 100 can be used as part of a package-on-package (PoP) configuration 400. In particular, the PoP configuration 400 can include the semiconductor package 100 and a semiconductor package 410 stacked on the semiconductor package 100. The semiconductor package 410 can include an upper surface 413, a lower surface 414 opposite the upper surface 413, and one or more side surfaces or sidewalls 415 adjacent the upper surface 413 and the lower surface 414. The upper surface 413 and lower surface 414 can each provide a generally planar surface. Moreover, the upper surface 413 can be parallel to the lower surface 414. The sidewalls 415 can adjoin the upper surface 413 to the lower surface 414. In some embodiments, the sidewalls 415 provide planar surfaces that are perpendicular to the upper surface 413 and the lower surface 414.

The lower surface 414 can include one or more external electrical connectors 450. The external electrical connectors 450 can include conductive bumps, conductive balls, conductive pillars, conductive lands, conductive pads, conductive lands, ball lands, and/or other conductive structures for operatively connecting a semiconductor die of the semiconductor package 400 to semiconductor package 100. Furthermore, the external electrical connectors 450 can be formed of conductive materials such as any one of or a combination of copper, nickel, gold, solder, etc. As shown, the external electrical connectors 450 can be physically and electrically connected to the upper surfaces 142 of the internal interconnect structures 140. Such coupling of the external electrical connectors 450 to the internal interconnect structures 140 can electrically connect internal components of the semiconductor package 400 (e.g., a semiconductor die) to the semiconductor die 160 and/or the external electrical connectors 150 of the semiconductor package 100.

FIG. 4 depicts an embodiment in which the semiconductor package 400 is directly connected to internal interconnect structures 140. Since the internal interconnect structures 140 are about the periphery of the semiconductor package 100 in the depicted embodiment, such a PoP configuration can likewise limit the external electrical connectors 450 to the periphery of the semiconductor package 400.

Figure 5:
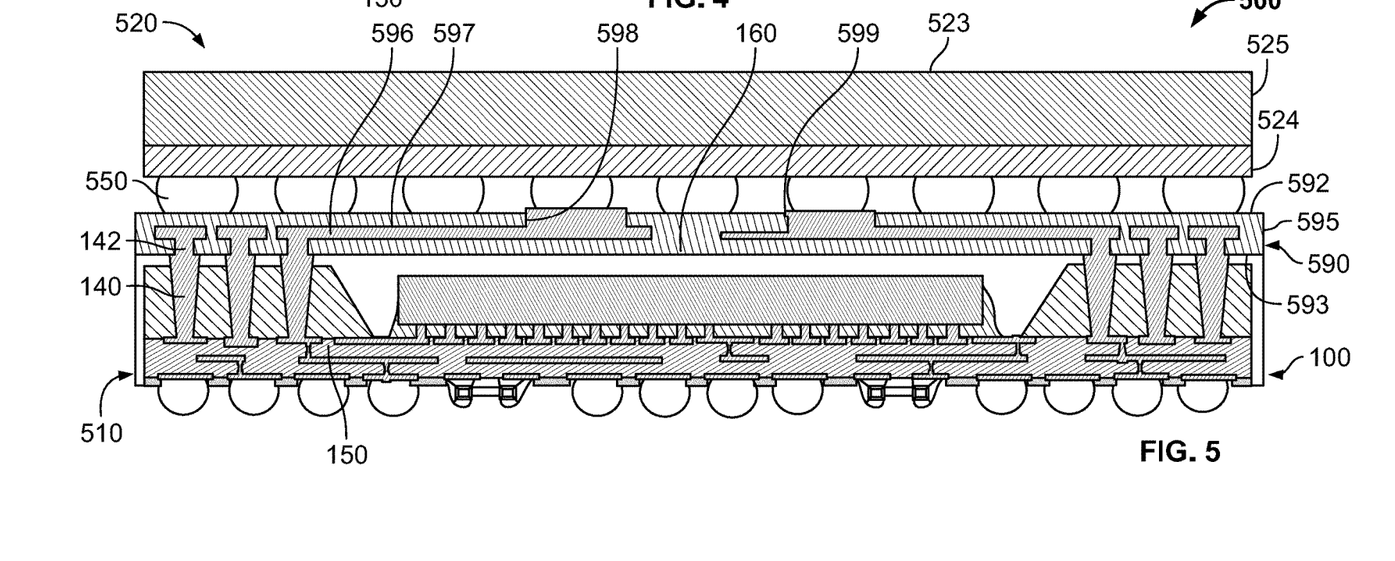
FIG. 5 provides a cross-sectional view of another package-on-package configuration utilizing the semiconductor package of FIG. 1 with an interposer between the semiconductor packages.

FIG. 5 depicts another embodiment of PoP configuration 500, which can provide greater flexibility with respect to positioning external electrical connectors 550 of a semiconductor package 520 to be stacked on the semiconductor package 510. In particular, the semiconductor package 510 can be implemented as the semiconductor package 100 with an interposer 590 on the upper surface 101 of the semiconductor package 100. The interposer 590 can be implemented in a similar fashion as the redistribution structure 122. In particular, the interposer 590 can include an upper surface 592, a lower surface 593 opposite the upper surface 592, and one or more side surfaces or sidewalls 595 adjacent the upper surface 592 and the lower surface 593. The upper surface 592 and lower surface 593 can each provide a generally planar surface. Moreover, the upper surface 592 can be parallel to the lower surface 593. The sidewalls 595 can adjoin the upper surface 592 to the lower surface 593. In some embodiments, the sidewalls 595 can provide planar surfaces that are perpendicular to the upper surface 592 and the lower surface 593.

The interposer 590 can include one or more conductive layers 596, one or more interdielectric layers 597 that separate the one or more conductive layers 596, and one or more conductive vias 598 that pass through one or more interdielectric layers 597 and electrically couple conductive layers 596 separated by the interdielectric layers 597. As shown, the uppermost conductive layer 596 can provide or be coupled to contact pads 599 on the upper surface 101 of the semiconductor package 100. The lowermost conductive layer 596 can be physically and electrically coupled to upper surfaces 142 of the internal interconnect structures 140. The conductive layers 596 and conductive vias 598 can electrically couple the internal interconnect structures 140 of the semiconductor package 100 to the contact pads 599 of the interposer 590.

The PoP configuration 500 can include the semiconductor package 520 stacked on the semiconductor package 510. The semiconductor package 520 can include an upper surface 523, a lower surface 524 opposite the upper surface 523, and one or more side surfaces or sidewalls 525 adjacent the upper surface 523 and the lower surface 524. The upper surface 523 and lower surface 524 can each provide a generally planar surface. Moreover, the upper surface 523 can be parallel to the lower surface 524. The sidewalls 525 can adjoin the upper surface 523 to the lower surface 524. In some embodiments, the sidewalls 525 can provide planar surfaces that are perpendicular to the upper surface 523 and the lower surface 524.

The lower surface 524 can include one or more external electrical connectors 550. The external electrical connectors 550 can include conductive bumps, conductive balls, conductive pillars, conductive lands, conductive pads, conductive lands, ball lands, and/or other conductive structures for operatively connecting a semiconductor die of the semiconductor package 520 to the semiconductor package 510. Furthermore, the external electrical connectors 550 can be formed of conductive materials such as any one of or a combination of copper, nickel, gold, solder, etc. As shown, the external electrical connectors 550 can be physically and electrically connected to the conductive pads 599 on the upper surface 592 of the interposer 590. Such coupling of the external electrical connectors 550 to the interposer 590 can electrically connect internal components of the semiconductor package 520 (e.g., a semiconductor die) to the semiconductor die 160 and/or the external electrical connectors 150 of the semiconductor package 100.

FIG. 5 depicts an embodiment in which the semiconductor package 520 is connected to the semiconductor package 510 via an interposer 590. The interposer 590 can distribute the contact pads 599 across its upper surface 592. As such, the interposer 590 can provide greater flexibility in positioning the external electrical connectors 550 in comparison to the PoP configuration 400 of FIG. 4.

Figure 6:
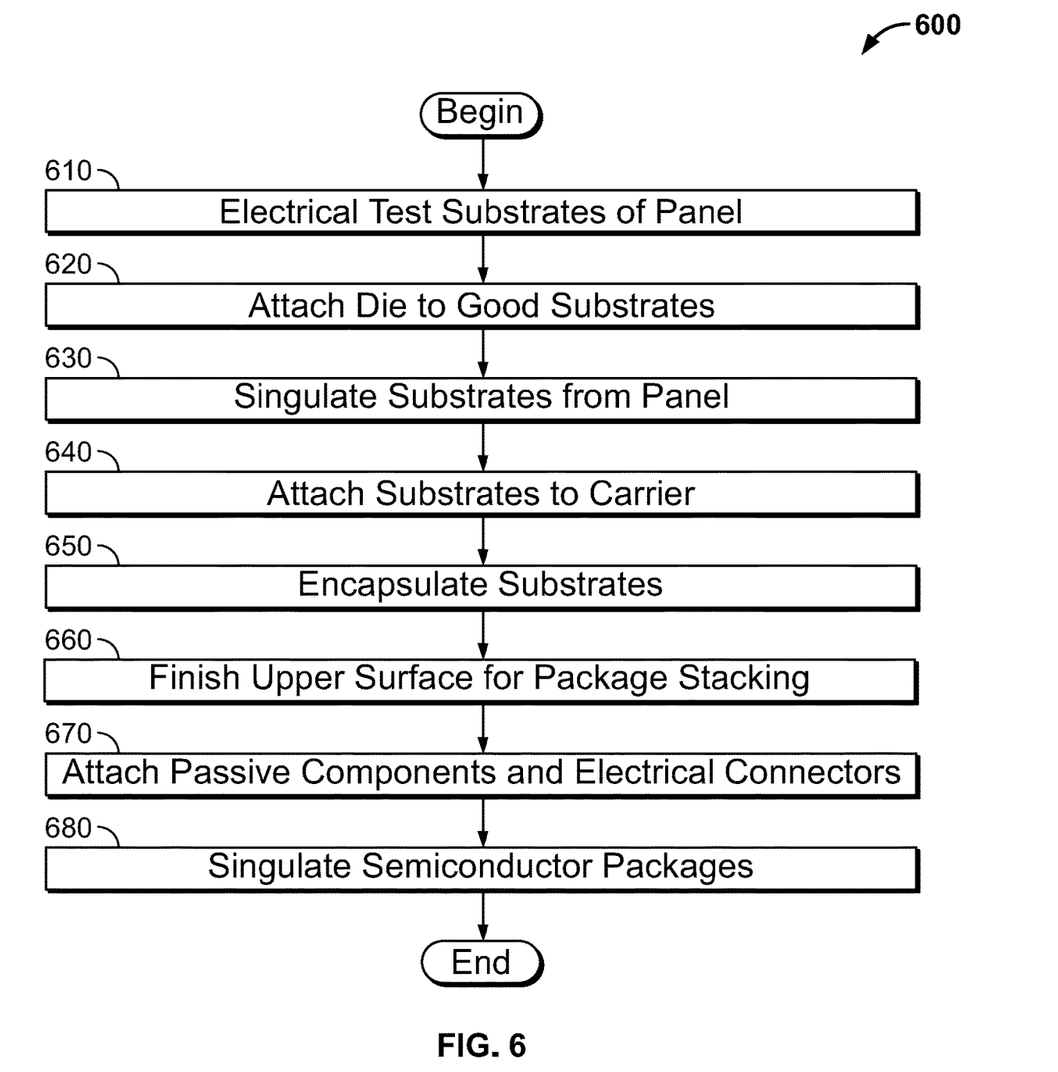
FIG. 6 depicts a flow chart of an exemplary method for fabricating the semiconductor package of FIG. 1.

Referring now to the flow chart of FIG. 6, an exemplary method 600 of fabricating the semiconductor packages 100, 510 of FIGS. 4 and 5 is depicted. In general, the method 600 can include electrical testing each cavity substrate 120 of a cavity substrate panel or strip 700 (block 610) and attaching a semiconductor die 110 to each cavity substrate 120 that passed the electrical testing (block 620). The method 600 can further include producing a repopulated or reconstituted carrier from the populated cavity substrates 120. To this end, the method 600 can include singulation of the populated cavity substrate panel 700 (block 630) and attaching the populated cavity substrates 120 to a carrier (block 640). The method 600 can also include encapsulating the populated substrate in an encapsulating material (block 650) and finishing the upper surface 102 of semiconductor package 100 for subsequent stacking of semiconductor packages 200, 30 (block 660). The method 600 can additionally include attaching external conductive connectors 150 and passive components 182 (block 670) and final singulation of the semiconductor packages 100, 101 (block 680). Further details of each of these aspects of method 600 are presented below.

As shown in FIG. 7A, a strip or panel 700 can include a plurality of cavity substrates 120. In particular, the panel 700 can arrange the plurality of cavity substrates 120 in an array having a plurality of rows and columns of cavity substrates 120. Electrical probes can be placed into electrical contact with the panel 700 and/or each cavity substrate 120. For example, electrical probes can be applied to the upper surface 142 of each internal interconnect structure 140 and each land 152 of the redistribution structure 122. Voltage and/or current signals can be applied to such upper surfaces 142 and lands 152 to confirm electrical continuity between the contact pads 129, lands 152, and/or interconnect structures 140. In this manner, the electrical testing can confirm that conductive layers 126 and conductive vias 128 of the redistribution structure 122 properly route signals between the contact pads 129, lands 152, and/or interconnect structures 140. Thus, known "good" cavity substrates 120 and known "defective" or not-good (NG) cavity substrates 120 of the panel 700 can be identified prior to attaching a semiconductor die 160 to the respective cavity substrate 120. Accordingly, waste associated with attaching semiconductor dies 160 to defective cavity substrates 120 can be avoided or reduced.

After the "good" and the "defective" cavity substrates 120 are identified, the method 600 at block 620 can include attachment of semiconductor dies 160 to the known good cavity substrates as shown in FIGS. 7A and 7B. In particular, as shown in FIG. 7B, the second surface 162 of the semiconductor die 160 can include one or more conductive attachment structures 166 (e.g., a conductive bump). The conductive attachment structures 166 can electrically and physically connect the semiconductor die 160 to the contact pads 129 of the redistribution structure 122. To this end, each conductive attachment structure 166 can be attached to a respective pad 129 in any of a variety of manners. For example, each conductive attachment structure 166 can be soldered to a respective contact pad 129 utilizing any of a variety of solder attachment processes (e.g., a mass reflow process, a thermal compression process, a laser soldering process, etc.). Also for example, each conductive attachment structure 129 can be attached to a respective contact pad 129 utilizing a conductive adhesive, paste, etc. Additionally, for example, each conductive attachment structure 166 can be attached to a respective contact pad 129 utilizing a direct metal-to-metal (e.g., solderless) bond.

In an example scenario, a solder paste can be applied to the contact pads 129. The conductive attachment structures 166 can be positioned on or in the solder paste (e.g., utilizing a pick-and-place process), and the solder paste can then be reflowed. After of the semiconductor die 160 is attached, the assembly can be cleaned (e.g., with hot de-ionized (DI) water, etc.), subjected to a flux clean and bake process, subjected to a plasma treatment process, etc.

In an example implementation, an underfill 170 can be formed between the semiconductor die 160 and the redistribution structure 122 of the cavity substrate 120. In particular, the underfill 170 can surround exposed portions of the conductive attachment structures 166 and contact pads 129, thereby encapsulating them in the underfill 170. The underfill 170 can comprise any of a variety of underfill materials. Also, the underfill 170 can be formed utilizing a variety of processes (e.g., a capillary underfilling process, utilizing a pre-applied underfill material, etc.). The underfill 170 between the semiconductor die 160 and the cavity substrate 120 can prevent or reduce warpage, for example due to differences in thermal expansion coefficients of the semiconductor die 160 and the cavity substrate 120.

After semiconductor die 160 are attached and under filled, the method 600 at block 640 can include production of a repopulated or reconstituted carrier from the populated good cavity substrates 120. To this end, the method 600 can include singulation of the cavity substrate panel 700 (block 630). In particular, the panel 700 can be singulated or cut (e.g., sawn by a diamond blade or laser beam, snap-separated, pull-separated, etc.) to separate each of the populated and good cavity substrates 120 from the panel 700. In such a scenario, a saw can pass along saw streets 710 of the panel 700 that lie between the cavities 136. As a result, the saw can pass through the redistribution structure 122 and cavity layer 130 thereby forming sidewalls 125 of the redistribution structure 122 and sidewalls 135 of the cavity layer 130. Moreover, the sawing along the saw streets 710 can planarize the sidewalls 125, 135 and can result in the sidewalls 125, 135 being co-planer to one another.

Figure 7C:
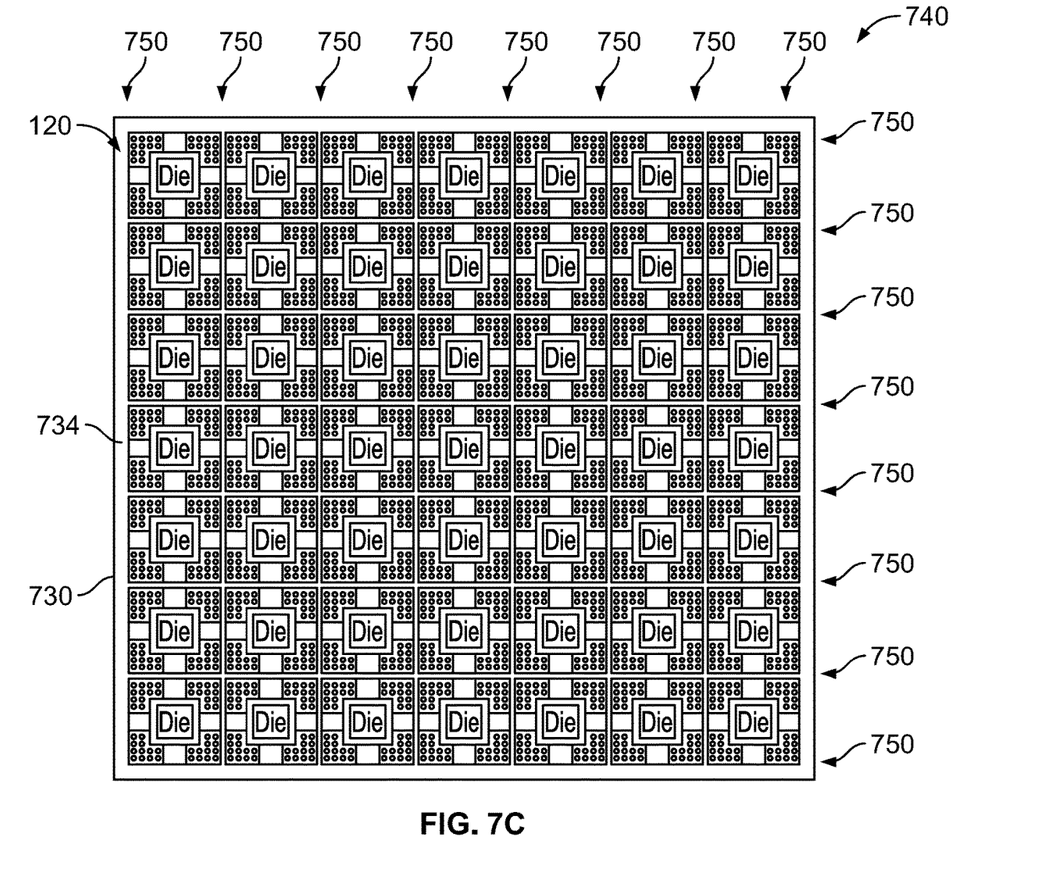
FIG. 7C depicts known good cavity substrates selected from the panel of FIG. 7B and repopulated on a carrier.

The singulated cavity substrates 120 can then be attached to a carrier 730 as shown in FIG. 7C to form a repopulated panel 740 of populated, good cavity substrates 120. The carrier 730 that provides a dummy plate upon which the populated cavity substrates 120 can be encapsulated. To this end, the carrier 730 can comprise a material such as a metal, an epoxy resin, a glass, or other materials suitable for supporting and carrying the cavity substrates 120 during the fabrication process.

As shown, the carrier 730 can include an upper surface having a separation film 734. In some embodiments, the separation film 734 can utilize a temporary adhesive that loosens when exposed to thermal energy, radiation, and/or chemicals. For example, a temporary adhesive of the separation film 734 can be subjected to laser (or light) irradiation to effect or assist with the separation or release of the cavity substrates 120 from the carrier 730. Moreover, in some embodiments, a solvent can be used to remove or loosen an adhesive of the separation film 734 from the cavity substrates 120.

As further shown in FIG. 7C, the cavity substrates 120 can be attached to the carrier 730 such that each cavity substrate 120 is spaced apart from one another. In particular, each cavity substrate 120 is spaced apart to define saw streets 750 for a subsequent final singulation. However, the width of the saw streets 750 is greater than the kerf of the saw of other singulation tool (e.g., laser cutting) to ensure sidewalls 125, 135 of the cavity substrate 120 remain covered with encapsulant 180 after the final singulation.

As also shown in FIG. 7C, the trenches 139 of the cavity substrates 120 provide channels are pathways between the cavities 136 and the saw streets 750. Such trenches 139 can aid the encapsulating process as encapsulating material can flow along the saw streets 750, along the trenches 139, and through the cavities 136. In the depicted embodiment, trenches 139 pass through each inner wall 137 of the cavities 136. Moreover, trenches 139 of one cavity substrate 120 align with trenches 139 of a neighboring cavity substrate 120. Such arrangement and alignment of the trenches 139 can further aid in evenly distributing the encapsulating material across the cavities 136 and saw streets 750.

Figure 7D:
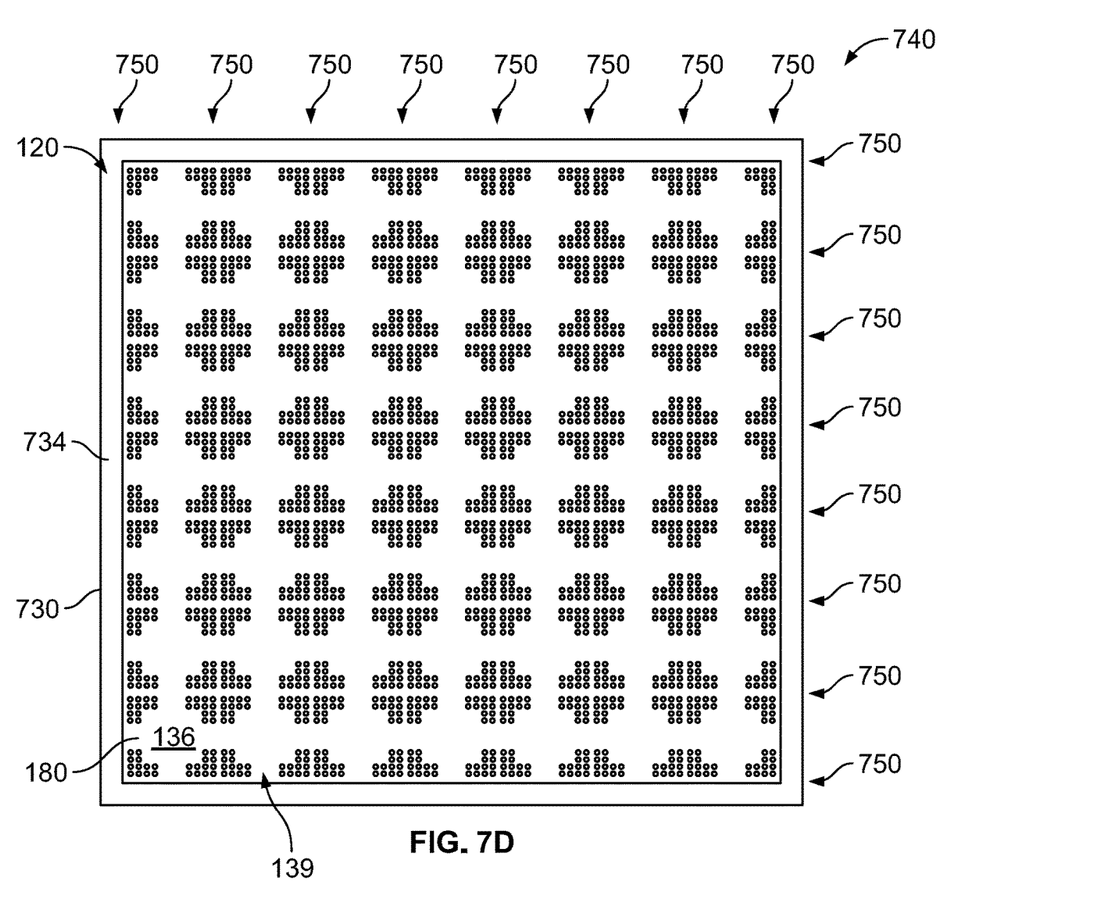
FIG. 7D depicts the repopulated carrier of FIG. 7C after the cavity substrates are encapsulated in an encapsulating material.

After the carrier 730 is populated with the good cavities substrates 120 as shown in FIG. 7C, the method 600 includes encapsulating the cavity substrates 120 in an encapsulating material at block 650. As shown in FIG. 7D, encapsulation of the cavity substrates 120 can fill the cavities 136, the trenches 139 and the saw streets 750 with encapsulant 180. In particular, such encapsulation process can form an encapsulant 180 over the cavity substrate 120, the attached semiconductor die 160, and the sidewalls 125, 135 of the cavity substrate 120. The encapsulant 180 can be formed in a variety of manners (e.g., compression molding, transfer molding, flood molding, etc.). Moreover, the encapsulant 180 can include a variety of types of encapsulating material. For example, the encapsulant 180 can comprise an epoxy, a thermosetting epoxy molding compound, a room temperature curing type compound, etc. As noted above, if the size of a filler (e.g., in inorganic filler or other particle component) of the encapsulating material is smaller than the gap between the cavity substrate 120 and the attached semiconductor die 160, then a separate underfill material might not be utilized. Thus, in some embodiments, the underfilling process and the encapsulating process can be combined into a single encapsulating process that under fills and encapsulates the semiconductor die 160.

After the semiconductor die 160 is encapsulated, the upper surface 101 of the semiconductor package 100 can be finished for subsequent stacking of semiconductor packages (block 660). See, e.g., FIGS. 4 and 5. Such finishing can include subjecting the encapsulant 180 to a planarization process such as a grinding process, a chemical mechanical polishing process, etc. The planarization process can remove portions of the encapsulant 180 covering the internal interconnect structures 140 as shown in FIG. 7D. In other embodiments, such finishing can include subjecting the encapsulant 180 to a plasma cleaning (Ar plasma or O2/CF4 plasma cleaning) to expose the internal interconnect structures 140.

If forming a semiconductor package 500, then the finishing at block 660 can further include forming the interposer 590 over the upper surface of the semiconductor package 100. To such end, the interposer 590 can be pre-fabricated and attached to the upper surface of the semiconductor package 100 such that the interposer 590 is physically and electrically connected to the exposed internal interconnect structures 140. In other embodiments, the interposer 590 can be built-up on the semiconductor package 100 via a series of patterned conductive layers 596 and interdielectric layers 597.

Figure 7E:
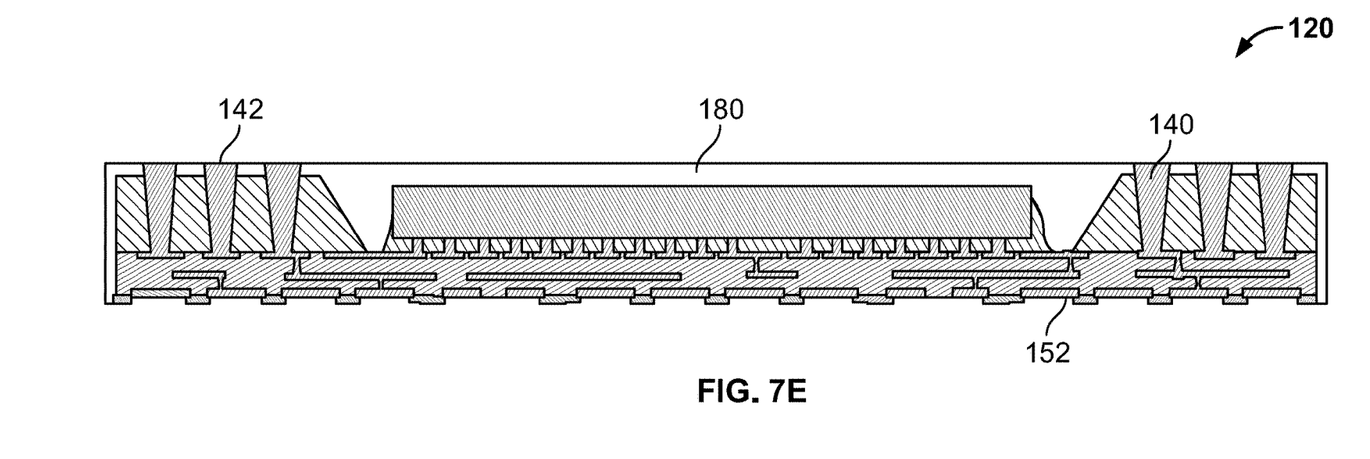
FIG. 7E depicts an encapsulated cavity substrate of FIG. 7D removed from the carrier.

The method 600 can additionally include attaching external conductive connectors 150 and passive components 182 (block 670). To this end, the encapsulated cavity substrates 120 can be released from the carrier 130. As explained above, the separation film 734 can include an adhesive that loosens when subjected to laser radiation and/or chemical agents. Thus, the adhesive can be subjected to the appropriate radiation, chemical agents, etc., to loosen the adhesive attachment between the cavity substrate 120 and the carrier 730. After the adhesive is loosened, the encapsulated cavity substrates 120 can be released from the carrier 730. An encapsulated cavity substrate 120 after being released from the carrier 730 is shown in FIG. 7E.

One or more passive components 182 can be attached to the lower surface 124 of the redistribution structure 122 as shown in FIG. 1. Moreover, external electrical connectors 150 such as conductive balls can be attached to lands 152 of the redistribution structure 122. The conductive balls can comprise a variety of characteristics. For example, the conductive balls can be formed of one of a eutectic solder (Sn37Pb), a high lead solder (Sn95Pb), a lead-free solder (SnAg, SnAu, SnCu, SnZn, SnZnBi, SnAgCu, and SnAgBi), a combination thereof, equivalents thereof, etc. The conductive balls can comprise, for example, a solder ball, a copper-core solder ball, etc. Moreover, the conductive balls can be attached to the lands 152 utilizing a variety of processes. For example, the conductive balls can be deposited (e.g., dropped, etc.) on the lands 152, and then a reflow temperature can be provided to reflow and secure the conductive balls to the lands 152.

After the external electrical connectors 150 and the passive components 182 are attached, the encapsulated cavity substrates 120 can undergo a final singulation. In particular, the encapsulated cavity substrates can be singulated or cut (e.g., sawn by a diamond blade or laser beam, snap-separated, pull-separated, etc.) to separate the semiconductor packages 100. In such a scenario, a saw can pass along saw streets 750 that lie between the encapsulated cavity substrates 120. As a result, the saw can pass through the encapsulant 180 and between the cavity substrates 120 thereby forming sidewalls 103 of semiconductor package 100. As noted above, the saw streets 750 are wider than the kerf of the saw or other singulation tool used to separate the semiconductor packages 100. As such, the sidewalls 125, 135 of the cavity substrate 120 remain covered in encapsulant 180 after such singulation. Such encapsulant 180 can help protect the sidewalls 125, 135. In particular, the encapsulant 180 can help prevent damage to the sidewalls 125, 135 that might result from physical contact or impact. As such, the encapsulant 180 can improve the structural integrity of the semiconductor package 100 and PoP configurations that utilize the semiconductor package 100.

Figure 8:
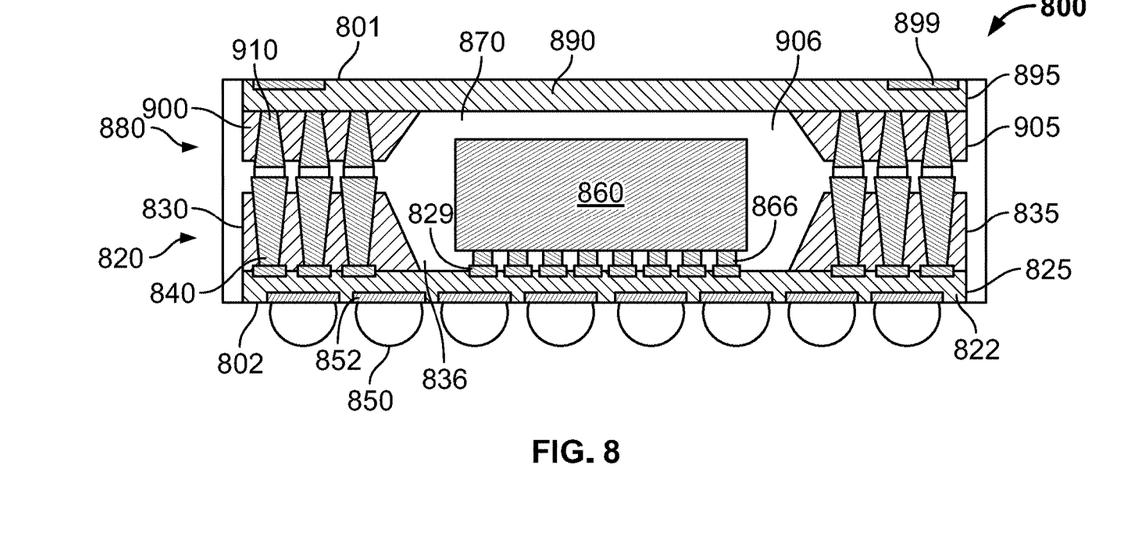
FIG. 8 provides a cross-sectional view of an embodiment of another semiconductor package fabricated in accordance with the present disclosure.

Referring now to FIG. 8, a cross-sectional view is provided that depicts another semiconductor package 800 in accordance with aspects of the present disclosure. In particular, the semiconductor package 800 shares various aspects with the semiconductor package 100 of FIG. 1. As such, the following focuses primarily on the differences between semiconductor package 800 and semiconductor package 100. As shown, the semiconductor package 800, like the semiconductor package 100, comprises an upper surface 801, a lower surface 802 opposite the upper surface 801, and one or more side surfaces or sidewalls 803 that join the upper surface 801 to the lower surface 802.

The semiconductor package 800 can include lower cavity substrates 820, external electrical connectors 850, a semiconductor die 860, an encapsulant 870, and an upper cavity substrate 880. The lower cavity substrate 820 can include a redistribution structure 822. The redistribution structure 822, similar to the redistribution structure 122, can include one or more conductive layers, interdielectric layers, and conductive vias configured to electrically couple lands 852 on a lower surface of the redistribution structure 822 to pads 829 on an upper surface of the redistribution structure 822.

The upper cavity substrate 880 can include an interposer 890. The interposer 990 can be implemented in a similar fashion as the interposer 590 of FIG. 5. In particular, the interposer 890 can include one or more conductive layers, interdielectric layers, conductive vias that electrically couple the internal interconnect structures 910 to the contact pads 899 on an upper surface of the interposer 890.

The lower cavity substrate 820 can include a cavity layer 830 on the redistribution structure 822. The lower cavity layer 830 can include a cavity 836 that passes through the cavity layer 830 and exposes contact pads 829 of the redistribution structure 822. The lower cavity substrate 820 can further include internal interconnect structures 840. The internal interconnect structures 840 can include any of a variety of conductive structures that pass through the cavity layer 830 and span between the upper surface and the lower surface of the cavity layer 830.

The upper cavity substrate 880 can include a cavity layer 900 on a lower surface of the interposer 890. The upper cavity layer 880 can include a cavity 906 that passes through the cavity layer 900 and exposes a lower surface of the interposer 890. The upper cavity substrate 890 can further include internal interconnect structures 910. The internal interconnect structures 910 can include any of a variety of conductive structures that pass through the cavity layer 890 and span between the upper surface and the lower surface of the cavity layer 890. As depicted, the internal interconnect structures 840 of the lower cavity substrate 820 can be bonded to the internal interconnect structures 910 of the upper cavity substrate 880 to electrically connect the interposer 890 to the redistribution structure 822.

The external electrical connectors 850 can include conductive bumps, conductive balls, conductive pillars, and/or other conductive structures electrical and physically coupled to the lands 852 of the redistribution structure 122. In general, the external electrical connectors 850 provide structures for operatively connecting the semiconductor package 800 to another semiconductor package, circuit board, etc.

As shown, the semiconductor die 860 can include conductive attachment structures 866 that are electrically coupled to one or more integrated circuit components of the semiconductor die 160. Furthermore, the semiconductor die 860 can be positioned within the cavities 836, 906 of the cavity substrates 820, 880. In particular, the conductive attachment structures 866 can be physically and electrically attached to contact pads 829 of the redistribution structure 822. In this manner, the integrated circuit components can be electrically coupled to the external electrical connectors 850.

In the depicted embodiment, sidewalls of the cavities 836, 906 are each shorter than the height of the attached semiconductor die 860. In particular, sidewalls of the semiconductor die 860 span between the two cavities 836, 906. As such, the semiconductor die 860 resides in the both cavities 836, 906.

Like the semiconductor package 100, an underfill can be formed between the semiconductor die 860 and the lower cavity substrate 820. However, in the depicted embodiment, the encapsulant 870 under fills the semiconductor die 860 and fills the cavities 836, 906. In this manner, the encapsulant 870 encapsulates the attached semiconductor die 860 and further secures the semiconductor die 860 to the cavity substrates 820, 880.

Similar to the semiconductor package 100, the cavity substrates 820, 880 can each include trenches that provide channels that pass between the sidewalls of the cavity layers 830, 900 and the cavity 836, 906. As such, the encapsulant 870 can further fill the trenches and cover the sidewalls 835, 905 of the cavity layers 830, 900 as well as sidewalls 825 of the redistribution structure 122 and sidewalls 895 of the interposer 890. In this manner, the encapsulant 870 can cover and protect the sidewalls of the cavity substrates 820, 880.

The present disclosure provides exemplary embodiments. The scope of the present disclosure is not limited by these exemplary embodiments. Numerous variations, whether explicitly provided for by the specification or implied by the specification, such as variations in structure, dimension, type of material and manufacturing process, can be implemented by one skilled in the art in view of this disclosure.

What is claimed is:
1. A semiconductor device, comprising:
a cavity substrate including:
an upper redistribution structure comprising an upper redistribution structure bottom side; and
a cavity structure protruding from the upper redistribution structure bottom side, the cavity structure defining a cavity that is accessible via a cavity opening in a cavity structure bottom side;
a lower redistribution structure comprising a lower redistribution structure top side;
a semiconductor die comprising a die bottom side coupled to the lower redistribution structure top side, wherein the semiconductor die extends through the cavity opening in the cavity structure bottom side and into the cavity of the cavity structure;
a column of one or more conductive interconnect structures that couples the upper redistribution structure bottom side to the lower redistribution structure top side; and
an encapsulant that laterally surrounds the semiconductor die and extends between a bottom side of the cavity structure and the lower redistribution structure top side,
wherein the upper redistribution structure comprises one or more interdielectric layers; and
wherein the cavity structure comprises a non-conductive material defining the cavity.

2. The semiconductor device of claim 1, wherein:
the lower redistribution structure further comprises a lower redistribution structure bottom side;
the semiconductor device further comprises external connection structures on the lower redistribution structure bottom side; and
the external connection structures are connected to the semiconductor die via the lower redistribution structure.

3. The semiconductor device of claim 2, further comprising one or more passive components attached to the lower redistribution structure bottom side.

4. The semiconductor device of claim 1, further comprising:
contact pads on an upper redistribution structure top side of the upper redistribution structure;
wherein the column of one or more conductive interconnect structures pass through the cavity structure; and
wherein the contact pads of the upper redistribution structure are coupled to the lower redistribution structure via the upper redistribution structure and the column of one or more conductive interconnect structures.

5. The semiconductor device of claim 4, further comprising:
a semiconductor package comprising external connection structures,
wherein the external connection structures couple the semiconductor package to the contact pads of the upper redistribution structure.

6. The semiconductor device of claim 1, wherein the encapsulant fills the cavity in the cavity structure.

7. The semiconductor device of claim 1, wherein the cavity structure comprises:
cavity structure sidewalls that protrude from the upper redistribution structure bottom side to the cavity structure bottom side; and
one or more trenches that pass through the cavity structure sidewalls.

8. The semiconductor device of claim 7, wherein the encapsulant fills the cavity in the cavity structure, and fills the one or more trenches that pass through the cavity structure sidewalls.

9. The semiconductor device of claim 1, wherein:
the column of one or more conductive interconnect structures passes through the cavity structure; and
a conductive interconnect structure of the column of one or more conductive interconnect structures is wider towards the lower redistribution structure than towards the upper redistribution structure.

10. The semiconductor device of claim 1, wherein:
the column of one or more conductive interconnect structures passes through the cavity structure;
the column of one or more conductive interconnect structures comprises a lower conductive interconnect structure that couples the column of one or more conductive interconnect structures to the lower redistribution structure top side; and
the lower conductive interconnect structure comprises a non-solder metal core ball coated with solder.

11. A cavity substrate, comprising:
a redistribution structure comprising a redistribution structure first side, a redistribution structure second side opposite the redistribution structure first side, and redistribution structure sidewalls that join the redistribution structure first side to the redistribution structure second side;
a cavity structure of non-conductive material protruding from the redistribution structure first side to a cavity structure first side, the cavity structure comprising inner sidewalls defining a cavity that is accessible via a cavity opening in the cavity structure first side; and
conductive interconnect structures that pass through the cavity structure, wherein each conductive interconnect structure comprises a first end exposed through the cavity structure first side and a second end coupled to the redistribution structure;
wherein the redistribution structure second side, the cavity structure first side, and the inner sidewalls of the cavity structure define outermost surfaces of the cavity substrate.

12. The cavity substrate of claim 11, wherein the cavity structure comprises:
cavity structure sidewalls that protrude from the redistribution structure first side to the cavity structure first side; and
one or more trenches that pass through the cavity structure sidewalls.

13. The cavity substrate of claim 11, further comprising:
contact pads on the redistribution structure second side; and
wherein the redistribution structure comprises one or more conductive layers that couple the contact pads to the conductive interconnect structures.

14. The cavity substrate of claim 11, wherein:
the redistribution structure comprises one or more layers of interdielectric material; and
the interdielectric material is different than the non-conductive material of the cavity structure.

15. The cavity substrate of claim 11, wherein a single layer of non-conductive material that extends from the redistribution structure first side to the cavity structure first side and defines the inner sidewalls of the cavity.

16. The cavity substrate of claim 11, wherein the first end of a first conductive interconnect structure of the conductive interconnect structures protrudes from the cavity structure first side.

17. A method of fabricating a semiconductor device, the method comprising:
attaching a die bottom side of a semiconductor die to a top side of a lower redistribution structure;
placing a cavity substrate over the semiconductor die and the lower redistribution structure such that the semiconductor die extends into a cavity defined by a cavity structure of the cavity substrate, wherein the cavity structure protrudes from a bottom side of an upper redistribution structure of the cavity substrate; and
coupling the cavity substrate to the top side of the lower redistribution structure such that a column of one or more conductive interconnect structures couples the bottom side of the upper redistribution structure to the top side of the lower redistribution structure.

18. The method of claim 17, wherein the column of one or more conductive interconnect structures passes through the cavity structure to the top side of the lower redistribution structure.

19. The method of claim 17, further comprising filling the cavity and trenches that pass through sidewalls of cavity structure with an encapsulant.

20. The cavity substrate of claim 11, wherein the second end of each conductive interconnect structure is coupled to the redistribution structure second side.

* * * * *